US009318291B2

(12) United States Patent
Yoon et al.

(10) Patent No.: US 9,318,291 B2
(45) Date of Patent: Apr. 19, 2016

(54) MECHANICAL SWITCH

(71) Applicant: Korea Advanced Institute of Science & Technology, Daejeon (KR)

(72) Inventors: Jun Bo Yoon, Daejeon (KR); Yong Ha Song, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 317 days.

(21) Appl. No.: 14/096,620

(22) Filed: Dec. 4, 2013

(65) Prior Publication Data

US 2014/0158506 A1 Jun. 12, 2014

(30) Foreign Application Priority Data

Dec. 6, 2012 (KR) ........................ 10-2012-0140837

(51) Int. Cl.

| | |
|---|---|
| ***B81B 3/00*** | (2006.01) |
| ***H01H 59/00*** | (2006.01) |
| *H01H 1/00* | (2006.01) |

(52) U.S. Cl.

CPC ... *H01H 59/0009* (2013.01); *H01H 2001/0052* (2013.01); *H01H 2001/0084* (2013.01)

(58) Field of Classification Search

CPC .................. H01H 59/0009; H01H 2001/0084; H01H 2001/0052

USPC .............. 200/181, 600, 512; 335/78; 257/254

See application file for complete search history.

(56) References Cited

U.S. PATENT DOCUMENTS

| | | | | |
|---|---|---|---|---|
| 2008/0047816 A1* | 2/2008 | Kawakubo | H01H 1/0036 | 200/512 |
| 2010/0051428 A1* | 3/2010 | Ikehashi | H01H 59/0009 | 200/181 |
| 2011/0108400 A1* | 5/2011 | Hong | B41J 2/04541 | 200/181 |
| 2012/0193685 A1* | 8/2012 | Goldsmith | H03K 17/975 | 257/254 |

* cited by examiner

*Primary Examiner* — Edwin A. Leon
(74) *Attorney, Agent, or Firm* — Foley & Lardner LLP

(57) ABSTRACT

Presented is a mechanical switch that may include a first electrode; a second electrode spaced apart from the first electrode; a first material electrically connected to the first electrode; and a second material electrically connected to the first electrode. Any one of a hardness, a Young's modulus, a melting point and an insensitivity degree to external contamination of the second material is lower than any corresponding one of a hardness, a Young's modulus a melting point and an insensitivity degree to external contamination of the first material. When the first electrode and the second electrode are electrically connected to each other, after the first material is connected to the second electrode, the second material is connected to the second electrode.

14 Claims, 17 Drawing Sheets

MECHANICAL SWITCH

CROSS-REFERENCE TO RELATED APPLICATIONS

This application claims the benefit of Korean Patent Application No. 10-2012-0140837, filed on Dec. 6, 2012, the contents of which are hereby incorporated by reference in its entirety into the present disclosure.

BACKGROUND

1. Field

Embodiments relate to a mechanical switch.

2. Description of Related Art

Unlike a non-contact switch, a mechanical switch includes a contact surface and opens and closes an electrical circuit by contacting with and separating from the contact surface through which current flows.

In the selection of a contact material of the mechanical switch, there is always a trade-off in a high reliability and a low contact resistance. That is, a hard material has a high hardness, a high Young's modulus and a high melting point, so that it has a high reliability. However, the hard material has hereby a high contact resistance. Contrary to this, a soft material has a low contact resistance and is physically weak, so that it has a low reliability.

SUMMARY

One embodiment is a mechanical switch including a first electrode; a second electrode spaced apart from the first electrode; a first material electrically connected to the first electrode; and a second material electrically connected to the first electrode. Any one of a hardness, a Young's modulus, a melting point and an insensitivity degree to external contamination of the second material is lower than any corresponding one of a hardness, a Young's modulus, a melting point and an insensitivity degree to external contamination of the first material. When the first electrode and the second electrode are electrically connected to each other, after the first material is connected to the second electrode, the second material is connected to the second electrode.

Here, the mechanical switch may further include a third electrode disposed spaced apart from the first electrode and the second electrode; a first moving part including one side electrically connected to the first electrode, and the other side disposed above the second electrode; and a second moving part including one side electrically connected to the first electrode, and the other side disposed above the second electrode. The first material may be disposed on the other side of the first moving part, and the second material may be disposed on the other side of the second moving part.

Here, the mechanical switch may further include a third material disposed on one side of the second electrode which is disposed under the first moving part, in such a manner as to contact with the other side of the first moving part; and a fourth material disposed on the one side of the second electrode which is disposed under the second moving part, in such a manner as to contact with the other side of the second moving part. The first material may be the same as the third material, and the second material may be the same as the fourth material.

Here, the mechanical switch may further include a third electrode disposed spaced apart from the first electrode and the second electrode; a first moving part including one side electrically connected to the second electrode, and the other side disposed above the first electrode; and a second moving part including one side electrically connected to the second electrode, and the other side disposed above the first electrode. The first material may be disposed on one side of the first electrode which is disposed under the first moving part, in such a manner as to contact with the other side of the first moving part, and the second material may be disposed on the one side of the first electrode which is disposed under the second moving part, in such a manner as to contact with the other side of the second moving part.

Here, the mechanical switch may further include a third electrode disposed spaced apart from the first electrode and the second electrode; and a moving part including one side electrically connected to the first electrode, and the other side disposed above the second electrode. The first material and the second material may be disposed on the other side of the moving part. When the moving part is electrically connected to the second electrode, the second material may be placed in a position to contact with the second electrode later than the first material.

Here, the mechanical switch may further include a third material disposed on one side of the second electrode which is disposed under the first material, in such a manner as to contact with the first material; and a fourth material disposed on the one side of the second electrode which is disposed under the second material, in such a manner as to contact with the second material. When the moving part is electrically connected to the second electrode, the fourth material may be placed in a position to contact with the second electrode later than the third material. The first material may be the same as the third material, and the second material may be the same as the fourth material.

Here, the mechanical switch may further include a third electrode disposed spaced apart from the first electrode and the second electrode; and a moving part including one side electrically connected to the second electrode, and the other side disposed above the first electrode. The first material and the second material may be disposed on one side of the first electrode which is disposed under the moving part, in such a manner as to contact with the other side of the moving part. When the moving part is electrically connected to the first electrode, the second material may be placed in a position to contact with the first electrode later than the first material.

Here, when the electrically connected first and second electrodes are separated from each other, after the second material is separated from the second electrode, the first material may be separated from the second electrode.

Another embodiment is a mechanical switch including a first electrode; a second electrode spaced apart from the first electrode; a first material electrically connected to the first electrode; and a second material electrically connected to the second electrode. Any one of a hardness, a Young's modulus, a melting point and an insensitivity degree to external contamination of the second material is lower than any corresponding one of a hardness, a Young's modulus, a melting point and an insensitivity degree to external contamination of the first material. When the first electrode and the second electrode are electrically connected to each other, after the first material is connected to the second electrode, the second material is connected to the first electrode.

Here, the mechanical switch may further include a third electrode disposed spaced apart from the first electrode and the second electrode; a first moving part including one side electrically connected to the first electrode, and the other side disposed above the second electrode; and a second moving part including one side electrically connected to the first electrode, and the other side disposed above the second electrode. The first material may be disposed on the other side of the first moving part, and the second material may be disposed under the second moving part in such a manner as to contact with the other side of the second moving part, and may be disposed on the second electrode.

Here, the mechanical switch may further include a third electrode disposed spaced apart from the first electrode and the second electrode; a first moving part including one side electrically connected to the second electrode, and the other side disposed above the first electrode; and a second moving part including one side electrically connected to the second electrode, and the other side disposed above the first electrode. The first material may be disposed on one side of the first electrode which is disposed under the first moving part, in such a manner as to contact with the other side of the first moving part. The second material may be disposed on the other side of the second moving part.

Here, the mechanical switch may further include a third electrode disposed spaced apart from the first electrode and the second electrode; and a moving part including one side electrically connected to the first electrode, and the other side disposed above the second electrode. The first material may be disposed on the other side of the moving part, and the second material is disposed on one side of the second electrode which is disposed under the moving part, in such a manner as to contact with the other side of the moving part. When the moving part is electrically connected to the second electrode, the second material may be placed in a position to contact with the second electrode later than the first material.

Here, the mechanical switch may further include a third electrode disposed spaced apart from the first electrode and the second electrode; and a moving part including one side electrically connected to the second electrode, and the other side disposed above the first electrode. The first material may be disposed on one side of the first electrode which is disposed under the moving part, in such a manner as to contact with the other side of the moving part, and the second material may be disposed on the other side of the moving part. When the moving part is electrically connected to the first electrode, the second material may be placed in a position to contact with the first electrode later than the first material.

Here, when the electrically connected first and second electrodes are separated from each other, after the second material is separated from the first electrode, the first material may be separated from the second electrode.

DETAILED DESCRIPTION

A thickness or size of each layer is magnified, omitted or schematically shown for the purpose of convenience and clearness of description. The size of each component does not necessarily mean its actual size.

In description of embodiments of the present invention, when it is mentioned that an element is formed "on" or "under" another element, it means that the mention includes a case where two elements are formed directly contacting with each other or are formed such that at least one separate element is interposed between the two elements. The "on" and "under" will be described to include the upward and downward directions based on one element.

Figure 1:
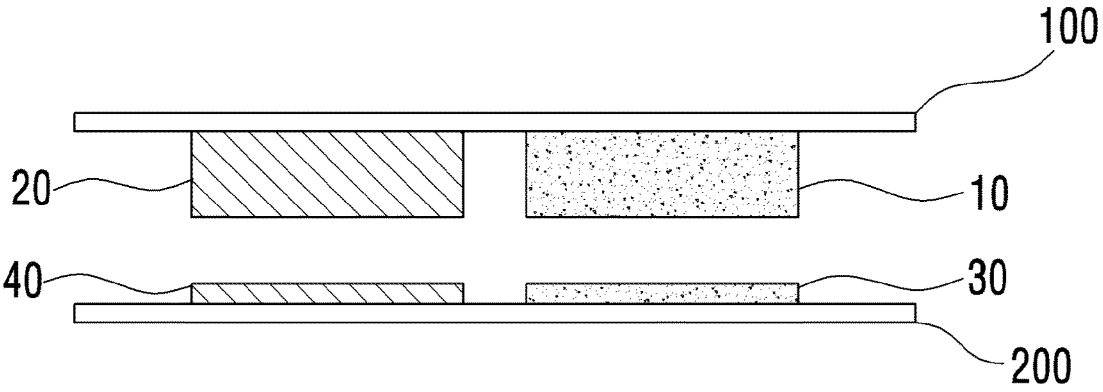
FIG. 1 is a conceptual view of a mechanical switch of the present invention.

FIG. 1 is a conceptual view of a mechanical switch of the present invention.

Referring to FIG. 1, the mechanical switch of the present invention may include a first electrode 100, a second electrode 200 spaced apart from the first electrode 100, and a first to a fourth materials 10, 20, 30, and 40.

The first and the second electrodes 100 and 200 may be a source electrode and a drain electrode. Here, when the first electrode 100 is the source electrode, the second electrode 200 may be the drain source, and when the first electrode 100 is the drain source, the second electrode 200 may be the source electrode.

The first electrode 100 may be electrically connected to the first and the second materials 10 and 20. Also, the second electrode 200 may be electrically connected to the third and the fourth materials 30 and 40. Here, the first material 10 and the third material 30 may be the same, and the second material 20 and the fourth material 40 may be the same.

The first and the second materials 10 and 20 connected to the first electrode 100 may be disposed spaced apart from each other, and the third and the fourth materials 30 and 40 connected to the second electrode 200 may be disposed spaced apart from each other.

The first material 10 may contact with the third material 30. Also, the second material 20 may contact with the fourth material 40.

The second and the fourth materials 20 and 40 may have a contact resistance lower than that of the first and the third materials 10 and 30. Also, the first and the third materials 10 and 30 may have reliability higher than that of the second and the fourth materials 20 and 40. Specifically, the hardness of the first and the third materials 10 and 30 may be greater than that of the second and the fourth materials 20 and 40. Also, the Young's modulus of the first and the third materials 10 and 30 may be higher than that of the second and the fourth materials 20 and 40. The melting point of the first and the third materials 10 and 30 may be higher than that of the second and the fourth materials 20 and 40. Also, the first and the third materials 10 and 30 may be more insensitive to external contamination than the second and the fourth materials 20 and 40. Here, the contamination means that when a certain material contacts with any other objects or air, the original state and composition of the material are excited, so that the material loses its purity. The occurrence of such a contamination stands in a way of accomplishing its original purpose and generates various obstacles. Reliability means a temporal stability of a product function, that is, a stability of a probability of appropriately performing a required function for an intended period of time with a machine, a tool or under given circumstances. Also, the reliability may include the number of the operations.

When the first electrode 100 and the second electrode 200 are electrically connected to each other, the first and the third materials 10 and 30 may contact with each other prior to the second and the fourth materials 20 and 40. When the first and the third materials 10 and 30 contact with each other prior to the second and the fourth materials 20 and 40, voltages of the first and the second electrodes 100 and 200 become the same as each other. In this case, an electric field (E-field) which is generated between the first electrode 100 and the second electrode 200 may be reduced. Here, the electric field may be generated by a voltage difference between the first electrode 100 and the second electrode 200. As a result, when the second material 20 and the fourth material 40 contact with each other, abrasion and arc due to the electric field may not occur. The arc means a phenomenon in which when a strong current flows through a contact material, the contact material is overheated by the contact resistance and then is evaporated. Here, due to the state in which the first material 10 is in contact with the third material 30 and the second material 20 is in contact with the fourth material 40, the first electrode 100 and the second electrode 200 may become connected in parallel by the first to the fourth materials 10 to 40. The mechanical switch connected in parallel by the first to the fourth materials 10 to 40 may have a contact resistance lower than the low contact resistance of the second material 20 and the fourth material 40. As a result, the lower contact resistance of the mechanical switch connected in parallel by the first to the fourth materials 10 to 40 is able to allow more current to flow.

When the electrically connected first and second electrodes 100 and 200 are separated from each other, the second and the fourth materials 20 and 40 may be separated from each other prior to the first and the third materials 10 and 30. Here, since the first and the third materials 10 and 30 are in contact with each other, a voltage of the first electrode 100 is the same as that of the second electrode 200 even though the second and the fourth materials 20 and 40 are separated from each other. As a result, even though the second and the fourth materials 20 and 40 are separated from each other, abrasion and arc will not occur.

The first to the fourth materials 10, 20, 30, and 40 may be carbon nano tube (CNT), refractory metal, alloy, oxidized metal, diamond, Platinum (Pt), Gold (Au), Silver (Ag), and the like.

Figure 2:
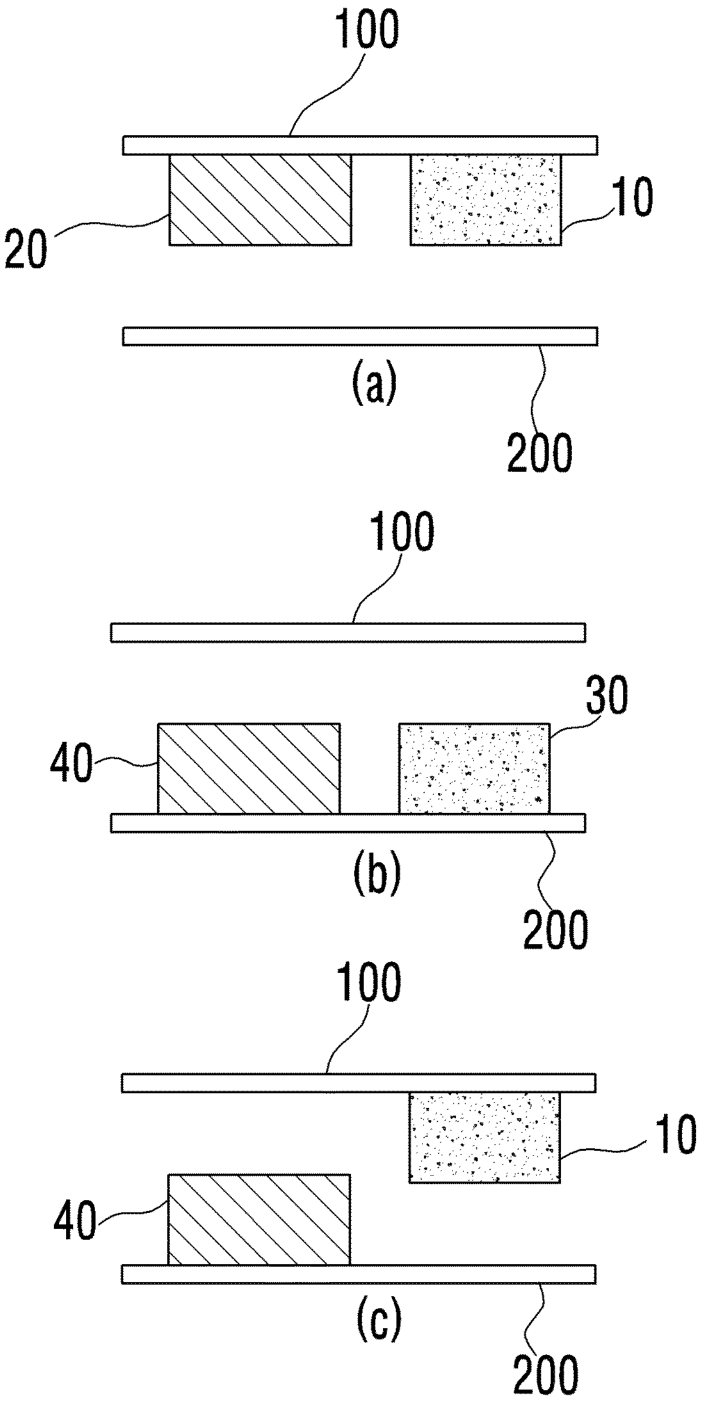
FIG. 2 is a view showing other examples of the mechanical switch shown in FIG. 1.

FIG. 2 is a view showing other examples of the mechanical switch shown in FIG. 1.

Unlike the mechanical switch shown in FIG. 1, a mechanical switch in which the third and the fourth materials 30 and 40 have not been disposed on the second electrode 200 is shown in (a) of FIG. 2. In the mechanical switch shown in (a) of FIG. 2, after the first material 10 is first electrically connected to the second electrode 200, the second material 20 may be electrically connected to the second electrode 200.

Unlike the mechanical switch shown in FIG. 1, a mechanical switch in which the first and the second materials 10 and 20 have not been disposed on the first electrode 100 is shown in (b) of FIG. 2. In the mechanical switch shown in (b) of FIG. 2, after the third material 30 is first electrically connected to the first electrode 100, the fourth material 40 may be electrically connected to the first electrode 100.

Unlike the mechanical switch shown in FIG. 1, a mechanical switch in which the second material 20 has not been disposed on the first electrode 100, and the third material 30 has not been disposed on the second electrode 200 is shown in (c) of FIG. 2. In the mechanical switch shown in (c) of FIG. 2, after the first material 10 is first electrically connected to the second electrode 200, the fourth material 40 may be electrically connected to the first electrode 100.

As such, the mechanical switches shown in FIG. 2 are able to perform the same operation as that of the mechanical switch shown in FIG. 1. Therefore, the mechanical switches shown in FIG. 2 may have a high reliability and a low contact resistance.

Hereafter, a mechanical switch to which the mechanical switch shown in FIG. 1 has been applied according to the embodiment of the present invention will be described with reference to the accompanying drawings.

First Embodiment

Figure 3:
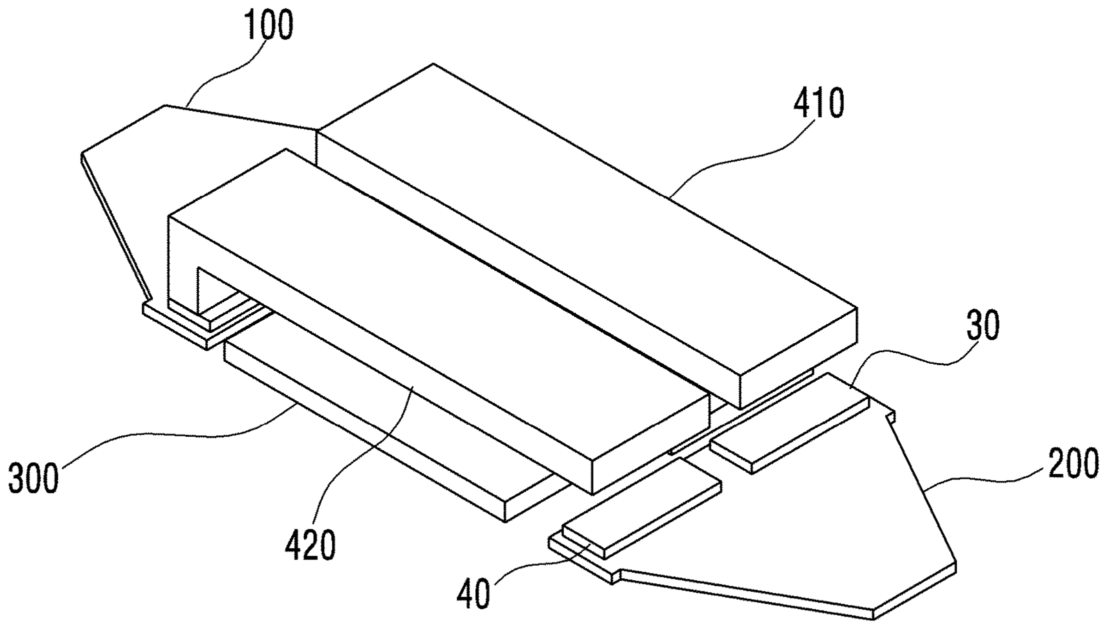
FIG. 3 is a perspective view of a mechanical switch according to a first embodiment of the present invention.
Figure 4:
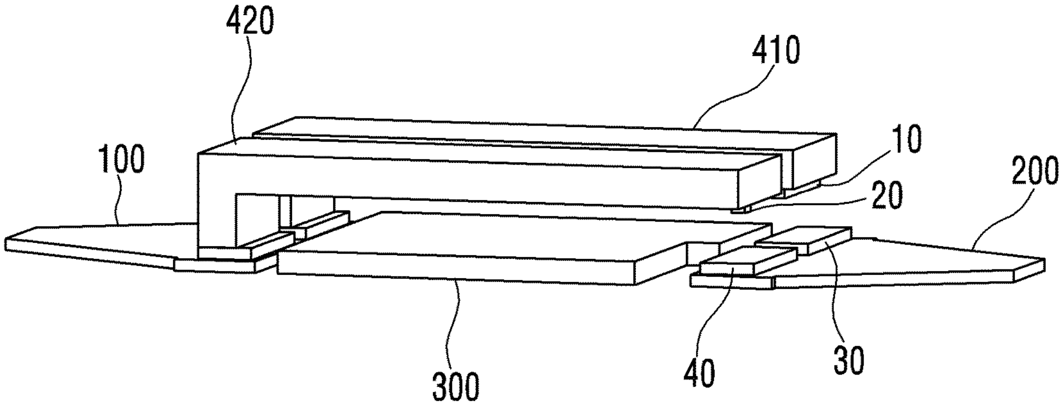
FIG. 4 is a side view of the mechanical switch according to the first embodiment of the present invention.
Figure 5:
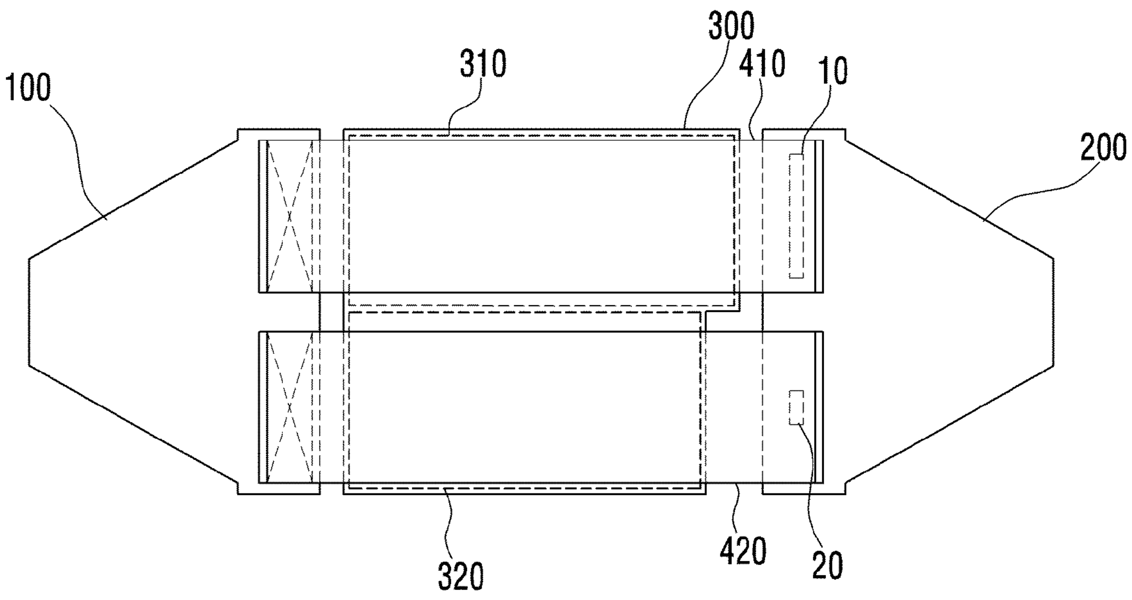
FIG. 5 is a top perspective plan view of the mechanical switch according to the first embodiment of the present invention.

FIG. 3 is a perspective view of a mechanical switch according to a first embodiment of the present invention. FIG. 4 is a side view of the mechanical switch according to the first embodiment of the present invention. FIG. 5 is a top perspective plan view of the mechanical switch according to the first embodiment of the present invention.

Referring to FIGS. 3 to 5, the mechanical switch according to the first embodiment may include a first electrode 100, a second electrode 200, a third electrode 300, a first moving part 410, a second moving part 420, and a first to a fourth materials 10 to 40.

The first electrode 100 may be a source electrode.

The first electrode 100 may be electrically connected to the first moving part 410 and the second moving part 420. Specifically, one side of the first moving part 410 and one side of the second moving part 420 may be connected to the first electrode 100.

The second electrode 200 may be a drain electrode.

The second electrode 200 may be spaced apart from the first electrode 100.

The third and the fourth materials 30 and 40 may be disposed on the second electrode 200. The third material 30 may be placed under the first moving part 410. The fourth material 40 may be placed under the second moving part 420. Here, an area of an electrical connection portion between the first material 10 and the third material 30 may be greater than an area of an electrical connection portion between the second material 20 and the fourth material 40. Specifically, when the area of the mutual electrical connection portion between the first material 10 and the third material 30 is greater than the area of the mutual electrical connection portion between the second material 20 and the fourth material 40, an adhesion force of the mutual electrical connection portion between the first material 10 and the third material 30 may be greater than an adhesion force of the mutual electrical connection portion between the second material 20 and the fourth material 40. The first and the third materials 10 and 30 having the adhesion force therebetween greater than that between the second and the fourth materials 20 and 40 may be separated later than the second and the fourth materials 20 and 40. Here, the adhesion force is generated between two mutually contact materials and means to cause them to adhere thereto.

The third electrode 300 may be a gate electrode.

The third electrode 300 may be disposed between the first electrode 100 and the second electrode 200. Also, the third electrode 300 may include a first controller 310 placed under the first moving part 410, and a second controller 320 placed under the second moving part 420. Here, an area of the first controller 310 may be greater than that of the second controller 320. Since the area of the first controller 310 is greater than that of the second controller 320, a pull-in voltage of the first moving part 410 is lower than that of the second moving part 420, so that the first moving part 410 is allowed to operate first. Specifically, an electrostatic attractive force may be generated between the third electrode 300 and the first and the second moving parts 410 and 420. The electrostatic attractive force is proportional to a facing area of two objects. That is, since the electrostatic attractive force of the first controller 310 is greater than that of the second controller 320, the first moving part 410 is able to move prior to the second moving part 420.

The first moving part 410 may include one side electrically connected to the first electrode 100, and the other side disposed above the second electrode 200. The second moving part 420 may include one side electrically connected to the first electrode 100, and the other side disposed above the second electrode 200. Here, the first material 10 may be disposed on the other side of the first moving part 410, and the second material 20 may be disposed on the other side of the second moving part 420.

An operation sequence of the mechanical switch according to the first embodiment will be described below.

Figure 6:
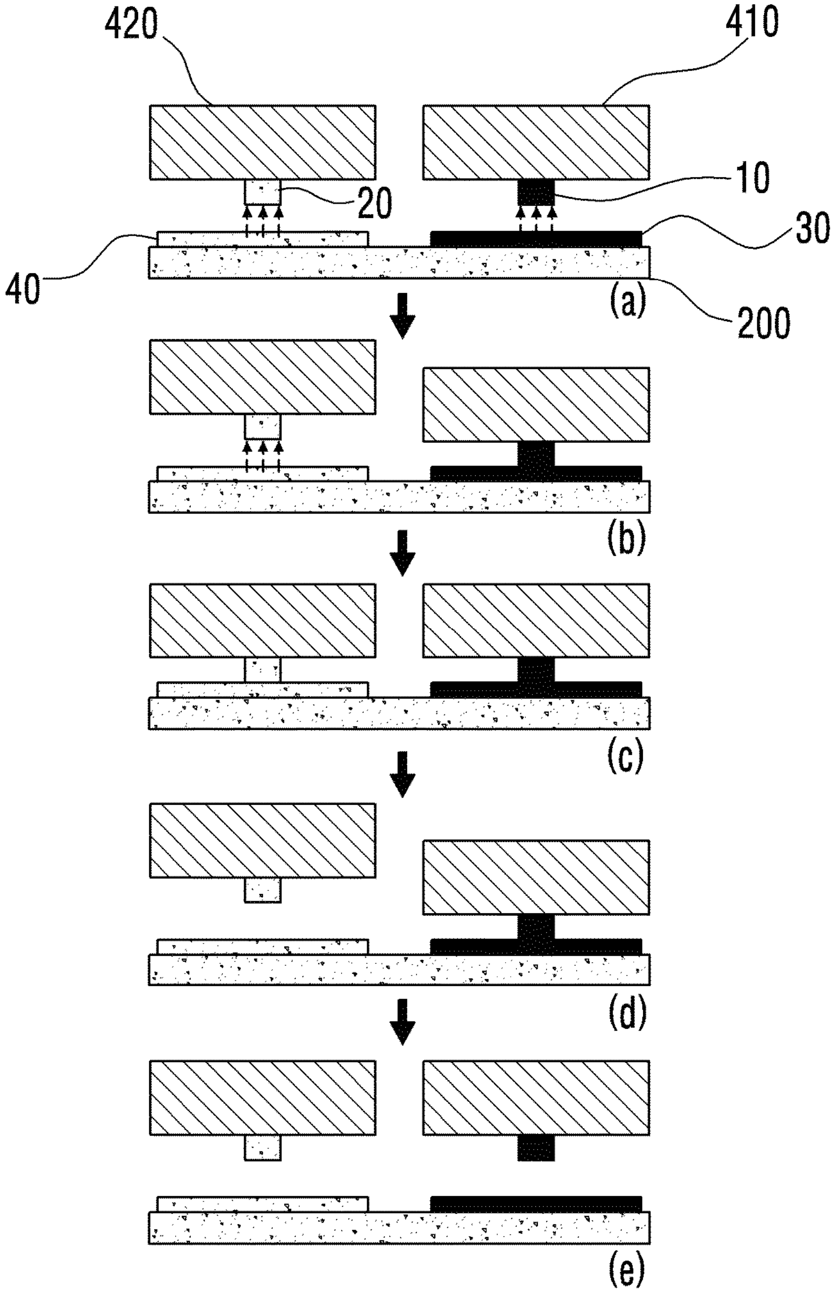
FIG. 6 is a view showing an operation sequence of the mechanical switch according to the first embodiment of the present invention.
Figure 7:
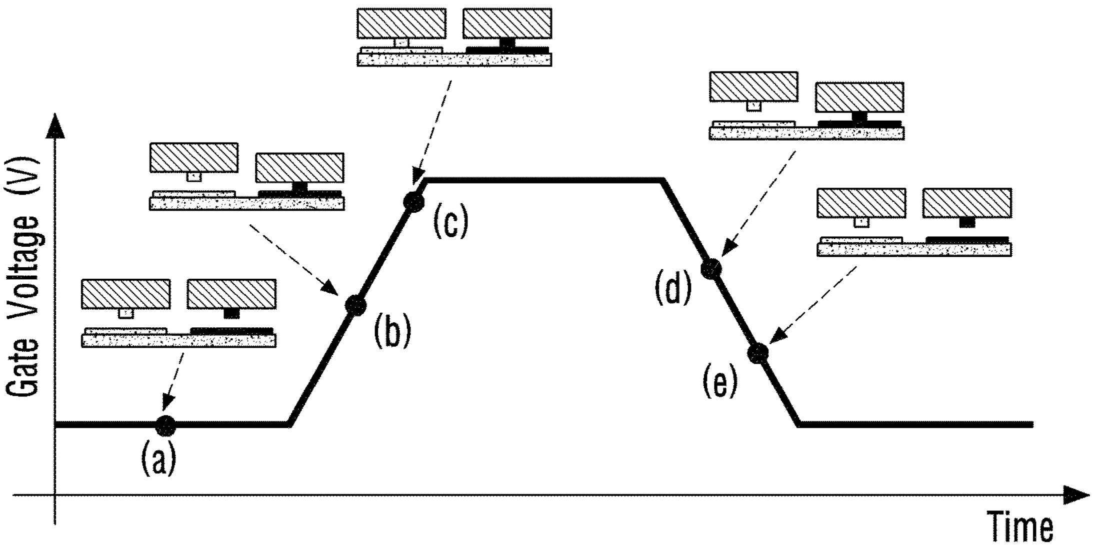
FIG. 7 is a graph showing a waveform of a voltage which is applied to a third electrode of the mechanical switch according to the first embodiment of the present invention.

FIG. 6 is a view showing an operation sequence of the mechanical switch according to the first embodiment. FIG. 7 is a graph showing a waveform of a voltage which is applied to the third electrode of the mechanical switch according to the first embodiment of the present invention.

Specifically, FIG. 6 is a view showing the time-based operation sequence of the mechanical switch according to the first embodiment. FIG. 7 is a graph showing operations of the first and the second moving parts 410 and 420 in accordance with the waveform of the voltage which is applied to the third electrode 300 shown in FIGS. 3 to 5. Here, (a) to (e) of FIG. 7 may be the same steps as those of (a) to (e) of FIG. 6.

When a voltage which is applied to the third electrode corresponds to (a) of FIG. 7, the first and the second moving parts 410 and 420 are spaced apart from the second electrode 200 as shown in (a) of FIG. 6.

When the voltage which is applied to the third electrode corresponds to (b) of FIG. 7, the first moving part 410 may be electrically connected to the second electrode 200 as shown in (b) of FIG. 6. Specifically, since the area of the first controller (not shown) of the third electrode (not shown) is greater than the area of the second controller (not shown), the pull-in voltage of the first moving part 410 may be lower than that of the second moving part 420. Therefore, the voltage (b) which is applied to the third electrode (not shown) is the same as the pull-in voltage of the first moving part 410 and is lower than the pull-in voltage of the second moving part 420. Accordingly, the first moving part 410 may be electrically connected to the second electrode 200 prior to the second moving part 420.

In FIG. 7, when the voltage which is applied to the third electrode (not shown) corresponds to (c), the second moving part 420 may be electrically connected to the second electrode 200 as shown in (c) of FIG. 6. Specifically, since the voltage (c) which is applied to the third electrode (not shown) is the same as the pull-in voltage of the second moving part 420, the second moving part 420 may be electrically connected to the second electrode 200.

In FIG. 7, when the voltage which is applied to the third electrode (not shown) corresponds to (d), the second moving part 420 may be separated from the second electrode 200 as shown in (d) of FIG. 6. Specifically, the voltage (d) which is applied to the third electrode (not shown) is lower than a pull-out voltage of the second moving part 420 and is higher than a pull-out voltage of the first moving part 410. Also, since the adhesion force between the second material 20 and the fourth material 40 is less than that between the first material 10 and the third material 30, the second moving part 420 may be separated from the second electrode 200 prior to the first moving part 410.

In FIG. 7, when the voltage which is applied to the third electrode (not shown) corresponds to (e), the first moving part 410 may be separated from the second electrode 200 as shown in (e) of FIG. 6. Specifically, since the voltage (e) which is applied to the third electrode (not shown) is lower than the pull-out voltage of the first moving part 410, the first moving part 410 may be separated from the second electrode 200.

As such, the mechanical switch according to the first embodiment connects anteriorly the material having a high reliability and connects posteriorly the material having a low contact resistance, thereby simultaneously obtaining the high reliability and the low contact resistance.

Figure 8:
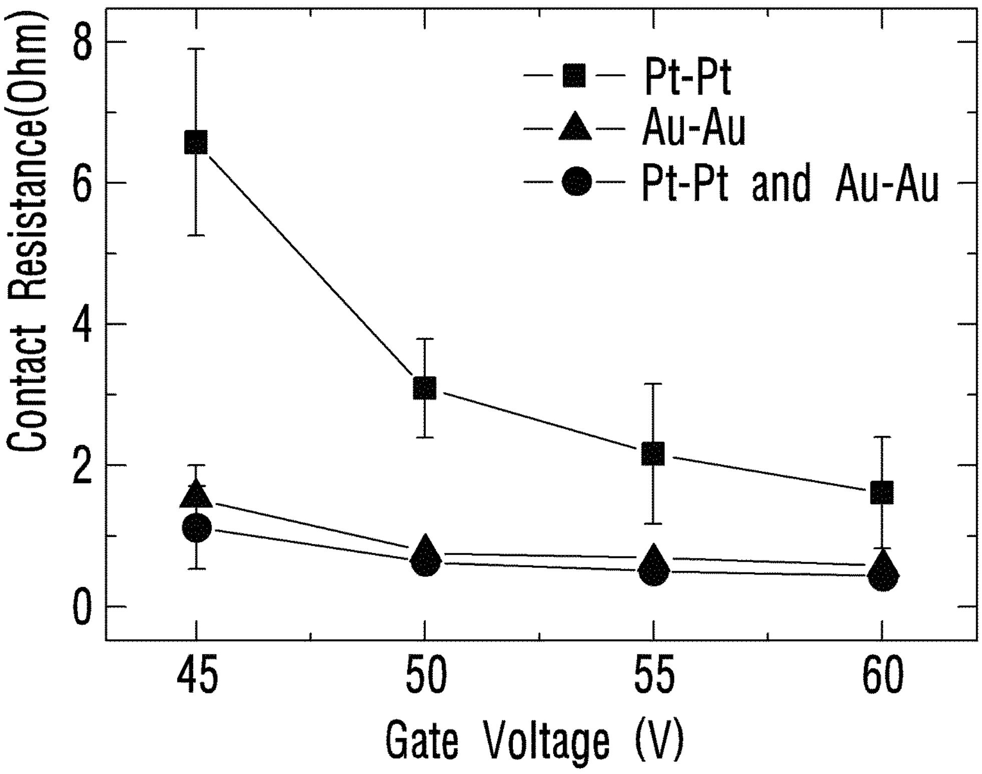
FIG. 8 is a graph showing a contact resistance depending on the voltage which is applied to the third electrode of the mechanical switch according to the first embodiment of the present invention.

FIG. 8 is a graph showing a contact resistance depending on the voltage which is applied to the third electrode of the mechanical switch according to the first embodiment of the present invention.

Specifically, the horizontal axis of FIG. 8 represents the voltage (V) which is applied to the third electrode, and the vertical axis represents the contact resistance (Ohm). Also, FIG. 8 is a graph obtained by using platinum (pt) as the first and the third materials 10 and 30 of the first switch 410 of FIGS. 3 to 5, and by using gold (Au) as the second and the fourth materials 20 and 40 of the second switch 420.

A line marked with squares of FIG. 8 represents the mechanical switch in which only the first switch 410 of FIGS. 3 to 5 is operated. Also, a line marked with triangles of FIG. 8 represents the mechanical switch in which only the second switch 420 of FIGS. 3 to 5 is operated. Also, a line marked with circles of FIG. 8 represents the mechanical switch in which the first switch 410 and the second switch 420 of FIGS. 3 to 5 are operated according to the operation sequence of FIG. 6.

Referring to FIG. 8, the mechanical switch in which the first switch and the second switch are operated according to the operation sequence of FIG. 6 may have a contact resistance lower than that of the mechanical switch in which only the first switch is operated. Also, the mechanical switch in which the first switch and the second switch are operated according to the operation sequence of FIG. 6 may have a contact resistance lower than that of the mechanical switch in which only the second switch is operated.

Figure 9:
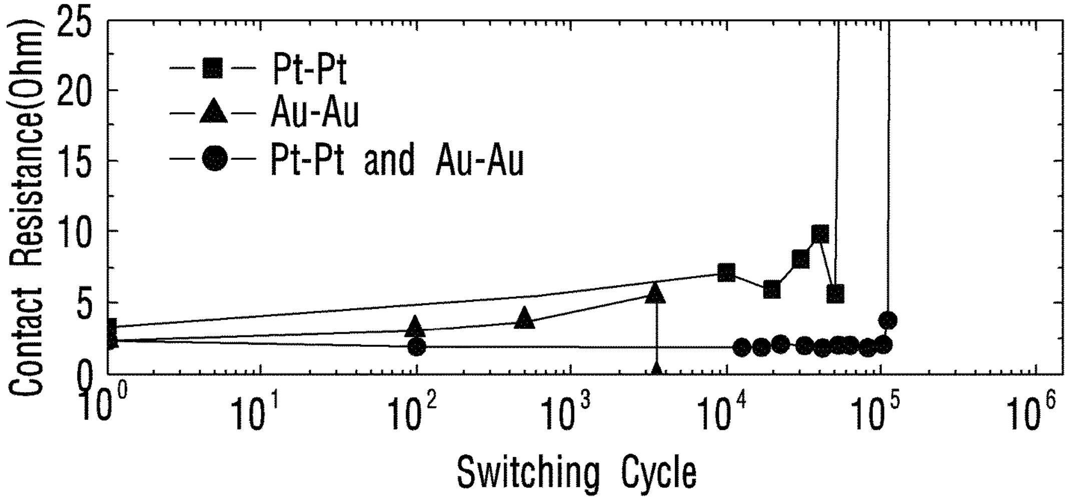
FIG. 9 is a graph showing the contact resistance and reliability of the mechanical switch according to the first embodiment of the present invention.

FIG. 9 is a graph showing the contact resistance and reliability of the mechanical switch according to the first embodiment of the present invention.

Specifically, the horizontal axis of FIG. 9 represents a switching cycle, and the vertical axis represents the contact resistance (Ohm).

In FIG. 9, the mechanical switches represented by a line marked with squares, a line marked with triangles, and a line marked with circles use the same switch as the mechanical switch used in FIG. 8. Here, a point where the contact resistance becomes '0' in the line marked with triangles means the occurrence of stiction. The stiction means a phenomenon in which the first to the fourth materials get scorched and stick by degeneration, wear and the like.

Referring to FIG. 9, the mechanical switch in which the first switch and the second switch are operated according to the operation sequence of FIG. 6 may have the larger number of operations than the number of operations of the mechanical switch in which only the first switch is operated. Also, the mechanical switch in which the first switch and the second switch are operated according to the operation sequence of FIG. 6 may have a contact resistance lower than the contact resistance of the mechanical switch in which only the second switch is operated.

Figure 10:
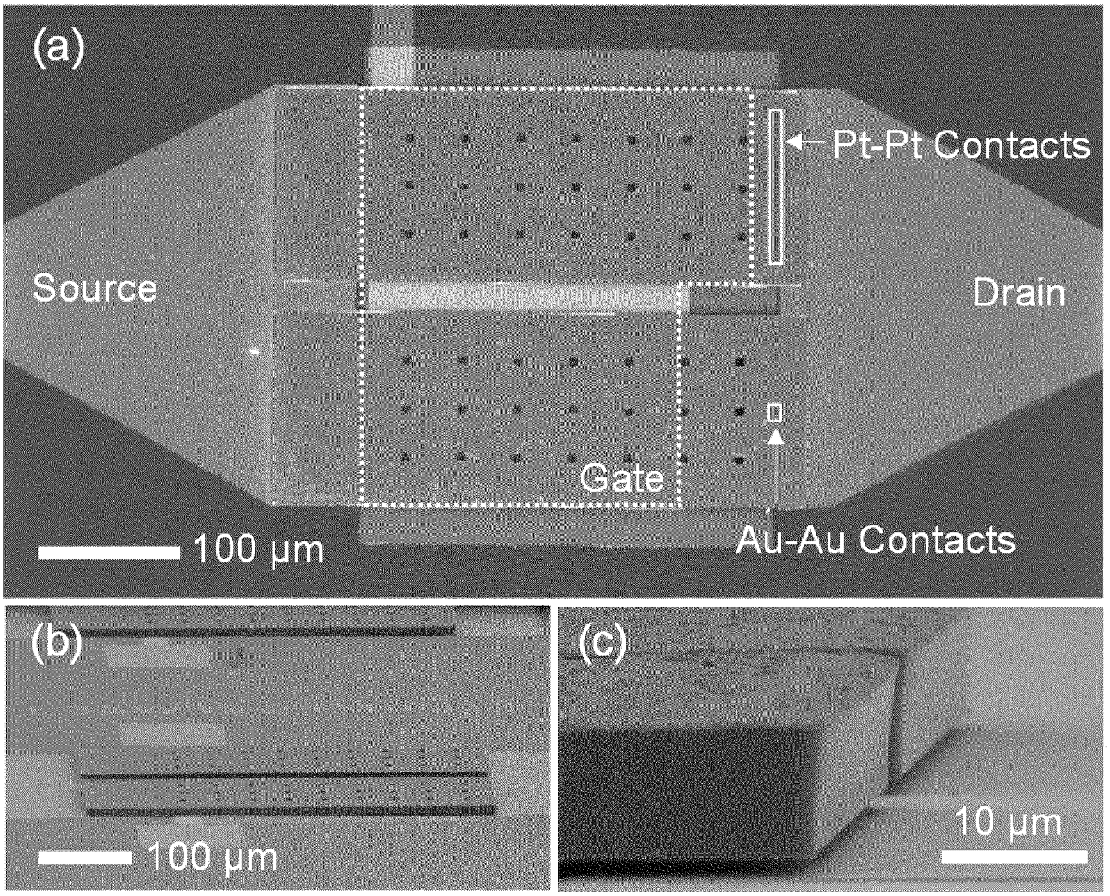
FIG. 10 shows an actual example of the mechanical switch according to the first embodiment of the present invention.

FIG. 10 shows an actual example of the mechanical switch according to the first embodiment of the present invention.

FIG. 10 is a scanning electron microscope photograph of the mechanical switch in which platinum (pt) is used as the first and the third materials of the first moving part and in which gold (Au) is used as the second and the fourth materials of the second moving part.

Second Embodiment

Figure 11:
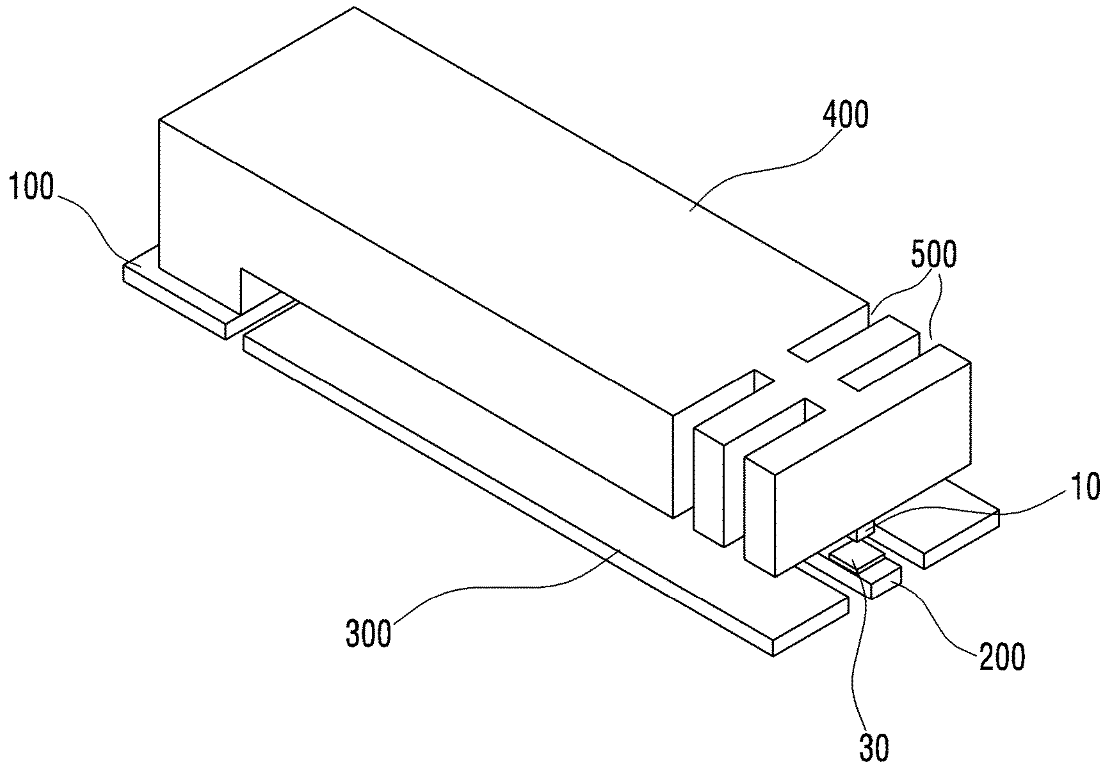
FIG. 11 is a perspective view of a mechanical switch according to a second embodiment of the present invention.
Figure 12:
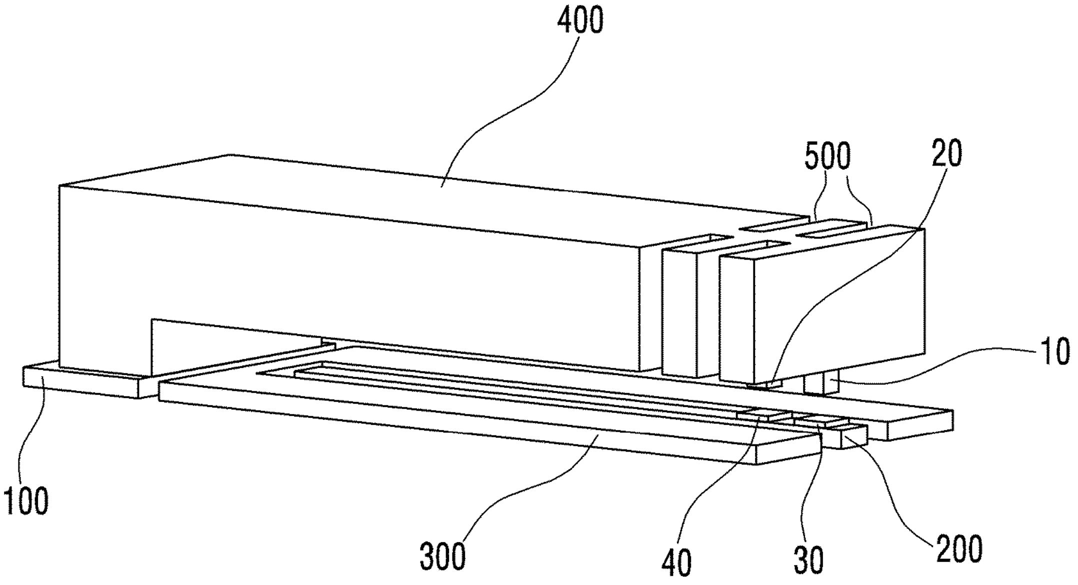
FIG. 12 is a side view of the mechanical switch according to the second embodiment of the present invention.
Figure 13:
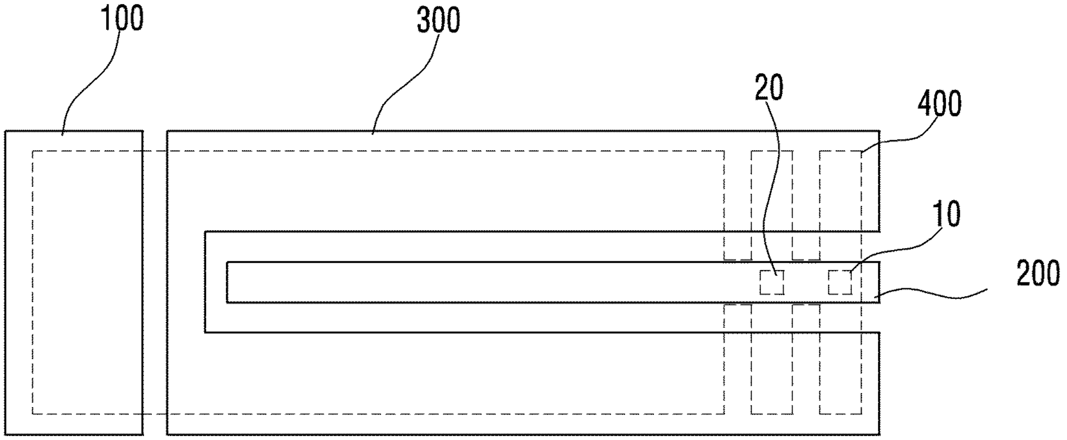
FIG. 13 is a top perspective plan view of the mechanical switch according to the second embodiment of the present invention.

FIG. 11 is a perspective view of a mechanical switch according to a second embodiment of the present invention. FIG. 12 is a side view of the mechanical switch according to the second embodiment of the present invention. FIG. 13 is a top perspective plan view of the mechanical switch according to the second embodiment of the present invention.

In components of the mechanical switch according to the second embodiment shown in FIGS. 11 to 13, the same reference numerals are assigned to the same components as those of the first embodiment. Hereafter, the mechanical switch according to the second embodiment will be described focusing on differences from the first embodiment.

Referring to FIGS. 11 to 13, the mechanical switch according to the second embodiment may include a first electrode 100, a second electrode 200, a third electrode 300, a moving part 400, and a first to a fourth materials 10, 20, 30 and 40.

The moving part 400 may be electrically connected to the first electrode 100. The moving part 400 may include one side electrically connected to the first electrode 100, and the other side disposed above the second electrode 200. The first and the second materials 10 and 20 may be disposed on the other side of the moving part 400. Here, the second material 20 may be disposed closer to the one side of the moving part 400 than the first material 10. A plurality of recesses 500 may be formed inwardly from the outer surface of the other side of the moving part 400. The moving part 400 having the recess 500 formed therein is able to allow the first and the third materials 10 and 30 to contact with each other prior to the second and the fourth materials 20 and 40 and to separate from each other later than the second and the fourth materials 20 and 40 by using a collapsing phenomenon. Here, the collapsing phenomenon means that a floating structure collapses when a voltage higher than the pull-in voltage is generated at the third electrode 300. Also, the shape and the number of the recesses 500 of the moving part 400 are not limited to those of FIGS. 11 to 13.

The third material 30 and the fourth material 40 may be disposed on the second electrode 200. The third material 30 may be disposed under the first material 10, and the fourth material 40 may be disposed under the second material 20. Here, when the moving part 400 is electrically connected to the second electrode 200, the fourth material 40 may be disposed to contact with the one side of the moving part 400 more closely to the one side of the moving part 400 than the third material 30. Here, unlike the first embodiment, an area of an electrical connection portion between the first material 10 and the third material 30 may or may not be the same as an area of an electrical connection portion between the second material 20 and the fourth material 40.

The third electrode 300 may have a shape of "U". Specifically, both ends of "U"-shaped third electrode 300 may face toward the second electrode 200, and the second electrode 200 may be inserted into the inside of the third electrode 300.

An operation sequence of the mechanical switch according to the second embodiment will be described below.

Figure 14:
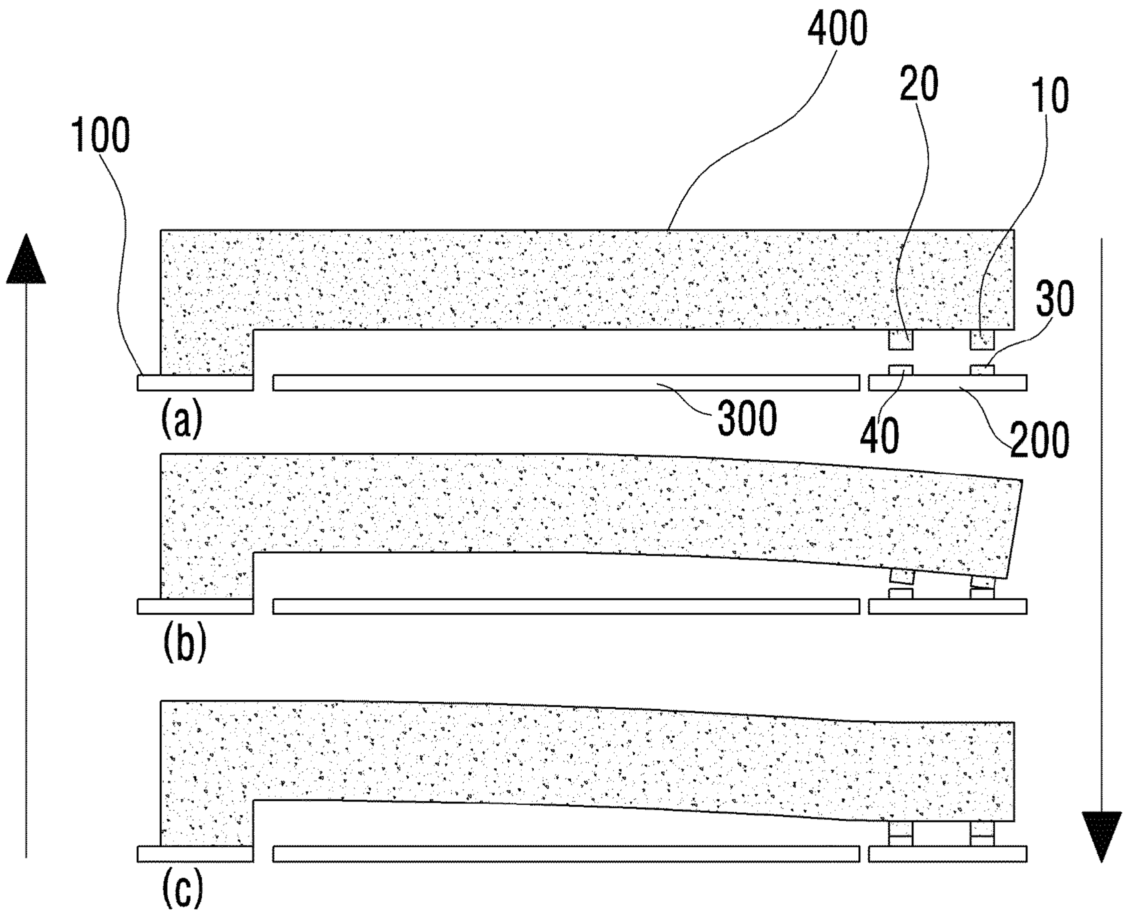
FIG. 14 is a view showing an operation sequence of the mechanical switch according to the second embodiment of the present invention.

FIG. 14 is a view showing the operation sequence of the mechanical switch according to the second embodiment of the present invention.

Specifically, the mechanical switch according to the second embodiment may be operated from (a) to (c) in an on-state, and may be operated from (c) to (a) in an off-state. Specifically, the mechanical switch according to the second embodiment may be operated in the order of (a)-(b)-(c)-(b)-(a). Here, the on-state means that a voltage has been applied to the third electrode 300, and the off-state means that the voltage has not been applied to the third electrode 300.

Before the mechanical switch according to the second embodiment is operated, the moving part 400 and the second electrode 200 are spaced from each other.

When the voltage is applied to the third electrode 300, the moving part 400 is bent by the collapsing phenomenon, and then the first material 10 and the third material 30 may contact with each other. Specifically, since the first material 10 is disposed closer to the other side of the moving part 400 than the second material 20, the first material 10 can be electrically connected to the second electrode 200 prior to the second material 20.

When the voltage which is applied to the third electrode 300 is more increased, the moving part 400 may be fully bent. Here, the second material 20 and the fourth material 40 may contact with each other.

When the voltage which is applied to the third electrode 300 is decreased, the bent moving part 400 may be straightened. Since the second and the fourth materials 20 and 40 are disposed closer to the one side of the moving part 400 than the first and the third materials 10 and 30, the second and the fourth materials 20 and 40 may be separated from each other prior to the first and the third materials 10 and 30.

When the voltage which is applied to the third electrode 300 is more decreased, the bent moving part 400 may be fully straightened. Here, the first and the third materials 10 and 30 may be separated from each other.

As such, the mechanical switch according to the second embodiment makes use of a typical square wave instead of the waveform of the voltage applied to the third electrode 300, thereby causing the first and the third materials 10 and 30 to contact anteriorly with each other and to be separated posteriorly from each other.

Figure 15:
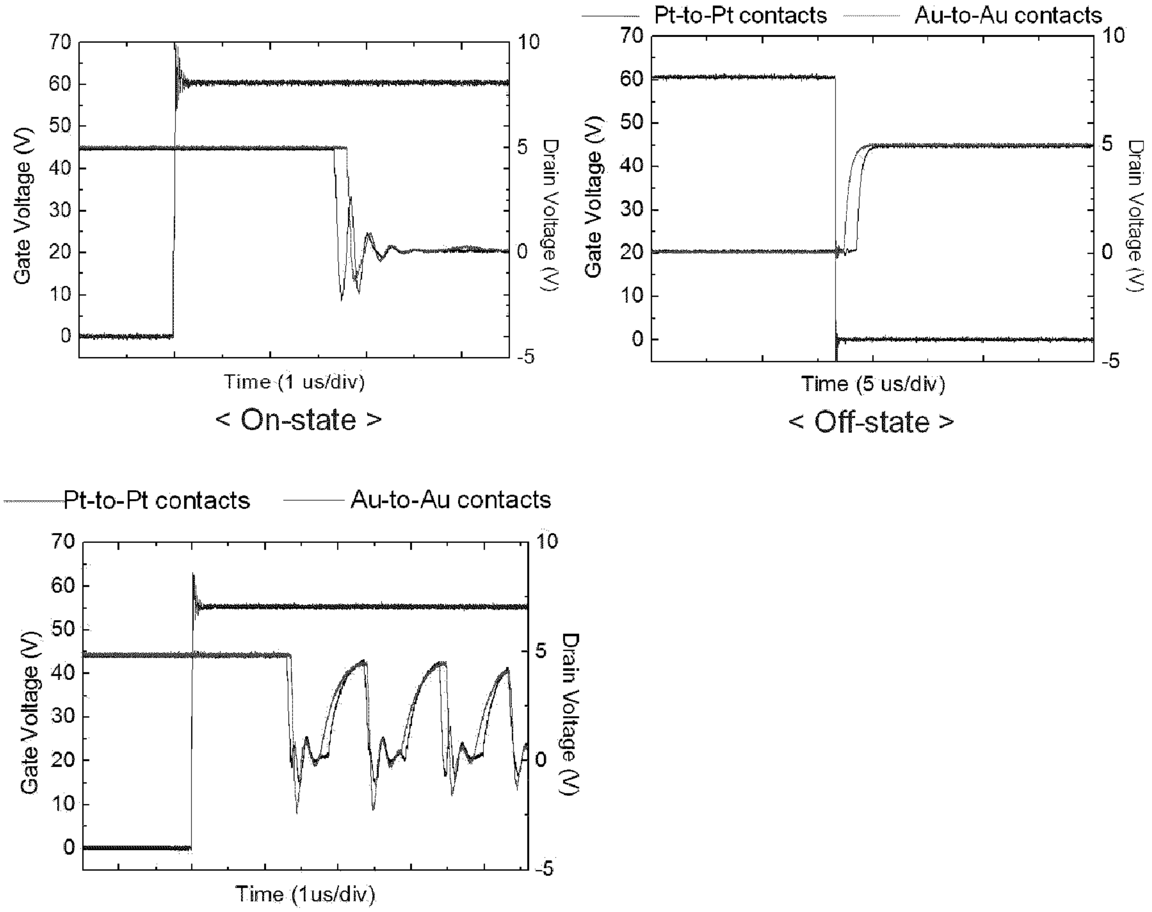
FIG. 15 is a graph showing an operation of the mechanical switch according to the second embodiment of the present invention.

FIG. 15 is a graph showing an operation of the mechanical switch according to the second embodiment of the present invention.

Specifically, the horizontal axis of FIG. 15 represents time. The left vertical axis represents a voltage (V) which is applied to the gate electrode. The right vertical axis represents a voltage (V) which is applied to the third and the fourth materials which have been connected to the drain electrode.

A blue line of FIG. 15 represents the voltage which is applied to the gate electrode. A black line of FIG. 15 represents the voltage which is applied to the third material. A red line of FIG. 15 represents the voltage which is applied to the fourth material. Here, when the voltage which is applied to the gate electrode becomes 60 V from 0 V, the on-state is obtained, and when the voltage which is applied to the gate electrode becomes 0 V from 60 V, the off-state is obtained. Also, when the voltage which is applied to the drain electrode drops to 0 V from V, the third and the fourth materials become electrically connected to the moving part.

Referring to the graph shown in the top part of the FIG. 15, when the mechanical switch according to the second embodiment is in the on-state, the third material may be electrically connected to the moving part prior to the fourth material. When the mechanical switch according to the second embodiment is in the off-state, the electrically connected fourth material may be separated from the moving part prior to the electrically connected third material.

Referring to the graph shown in the bottom part of FIG. 15, when the mechanical switch according to the second embodiment is in the on-state, the third material may contact with the moving part prior to the fourth material, and the fourth material may be separated from the moving part prior to the third material, in spite of a bouncing phenomenon occurring between the moving part and the third and the fourth materials. Here, the bouncing phenomenon means that at the moment when two objects contact physically with each other, they finely contact with and then separate from each other.

As such, the mechanical switch according to the second embodiment causes the first and the third materials to contact with each other first, and then causes the second and the fourth materials contact with each other, without using a particular waveform of the voltage.

Figure 16:
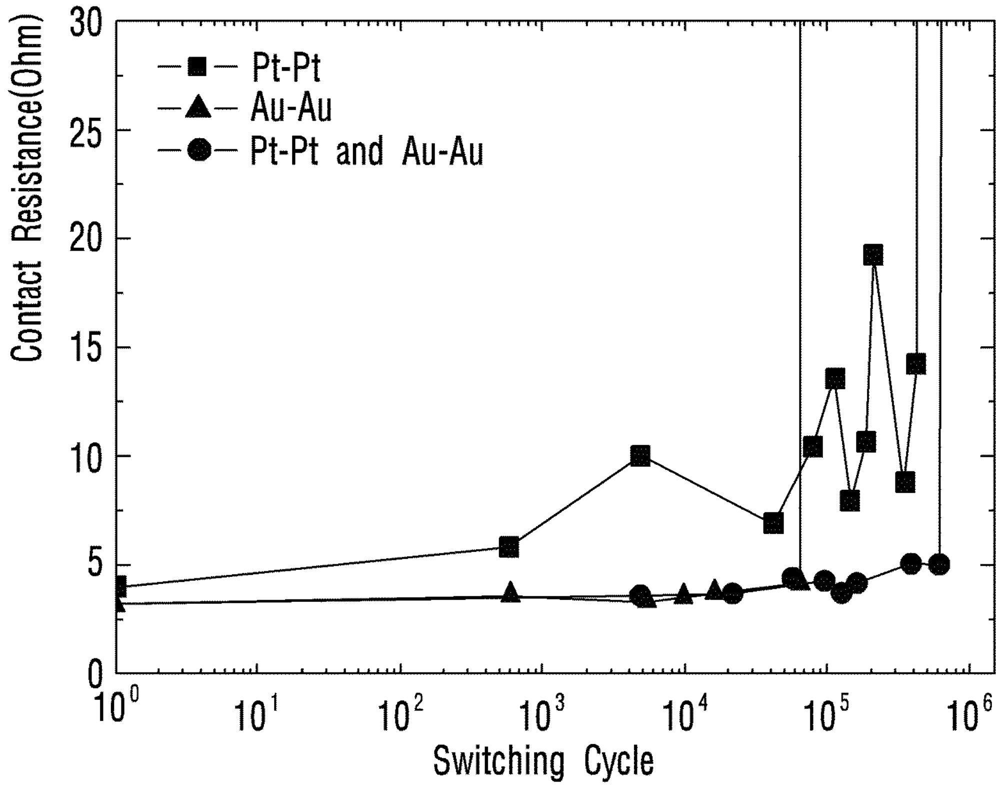
FIG. 16 is a graph showing the contact resistance and reliability of the mechanical switch according to the second embodiment of the present invention.

FIG. 16 is a graph showing the contact resistance and reliability of the mechanical switch according to the second embodiment of the present invention.

Specifically, the horizontal axis of FIG. 16 represents a switching cycle, and the vertical axis represents a contact resistance (Ohm).

A line marked with squares of FIG. 16 represents the mechanical switch in which platinum (pt) is used as the first to the fourth materials 10, 20, 30 and 40 of FIGS. 11 of 13. Also, a line marked with triangles of FIG. 16 represents the mechanical switch in which gold (Au) is used as the first to the fourth materials 10, 20, 30 and 40 of FIGS. 11 of 13. Also, a line marked with circles of FIG. 16 represents the mechanical switch in which platinum (pt) is used as the first and the third materials 10 and 30, and gold (Au) is used as the second and the fourth materials 20 and 40.

Referring to FIG. 16, the mechanical switch in which platinum (pt) is used as the first and the third materials, and gold (Au) is used as the second and the fourth materials may have a switching cycle greater than or similar to that of the mechanical switch in which platinum (pt) is used as the first to the fourth materials. Also, the mechanical switch in which platinum (pt) is used as the first and the third materials, and gold (Au) is used as the second and the fourth materials may have a low contact resistance similar to that of the mechanical switch in which gold (Au) is used as the first to the fourth materials.

Figure 17:
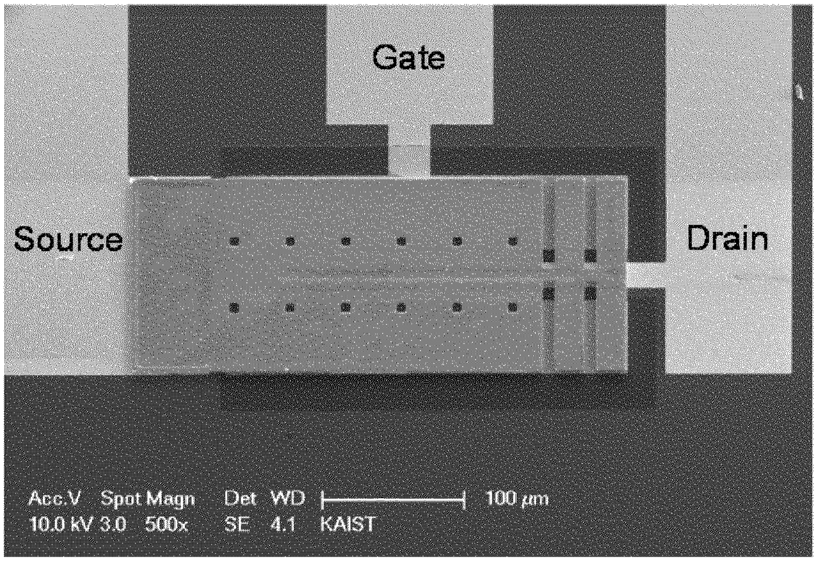
FIG. 17 shows an actual example of the mechanical switch according to the second embodiment of the present invention.

FIG. 17 shows an actual example of the mechanical switch according to the second embodiment of the present invention.

FIG. 17 is a scanning electron microscope photograph of the mechanical switch in which platinum (pt) is used as the first and the third materials and in which gold (Au) is used as the second and the fourth materials.

The mechanical switches according to the embodiments shown in FIGS. 1 to 17 allow a material having a high hardness, a high Young's modulus, and a high melting point to be electrically connected prior to and separated later than a material having a low hardness, a low Young's modulus, and a low melting point, thereby simultaneously obtaining the high reliability and the low contact resistance.

Also, through use of the two moving parts 410 and 420 and through the one moving part 400, the high reliability and the low contact resistance can be simultaneously obtained.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A mechanical switch comprising:

a first electrode;

a second electrode spaced apart from the first electrode;

a first material electrically connected to the first electrode; and a second material electrically connected to the first electrode, wherein any one of a hardness, a Young's modulus, a melting point and an insensitivity degree to external contamination of the second material is lower than any corresponding one of a hardness, a Young's modulus, a melting point and an insensitivity degree to external contamination of the first material, and wherein, when the first electrode and the second electrode are electrically connected to each other, after the first material is connected to the second electrode, the second material is connected to the second electrode.

2. The mechanical switch of claim 1, further comprising:

a third electrode disposed spaced apart from the first electrode and the second electrode;

a first moving part including one side electrically connected to the first electrode, and the other side disposed above the second electrode; and a second moving part including one side electrically connected to the first electrode, and the other side disposed above the second electrode, wherein the first material is disposed on the other side of the first moving part, and the second material is disposed on the other side of the second moving part.

3. The mechanical switch of claim 2, further comprising:

a third material disposed on one side of the second electrode which is disposed under the first moving part, in such a manner as to contact with the other side of the first moving part; and a fourth material disposed on the one side of the second electrode which is disposed under the second moving part, in such a manner as to contact with the other side of the second moving part, wherein the first material is the same as the third material, and the second material is the same as the fourth material.

4. The mechanical switch of claim 1, further comprising:

a third electrode disposed spaced apart from the first electrode and the second electrode;

a first moving part including one side electrically connected to the second electrode, and the other side disposed above the first electrode; and a second moving part including one side electrically connected to the second electrode, and the other side disposed above the first electrode, wherein the first material is disposed on one side of the first electrode which is disposed under the first moving part, in such a manner as to contact with the other side of the first moving part, and wherein the second material is disposed on the one side of the first electrode which is disposed under the second moving part, in such a manner as to contact with the other side of the second moving part.

5. The mechanical switch of claim 1, further comprising:

a third electrode disposed spaced apart from the first electrode and the second electrode; and a moving part including one side electrically connected to the first electrode, and the other side disposed above the second electrode, wherein the first material and the second material are disposed on the other side of the moving part, and wherein, when the moving part is electrically connected to the second electrode, the second material is placed in a position to contact with the second electrode later than the first material.

6. The mechanical switch of claim 5, further comprising:

a third material disposed on one side of the second electrode which is disposed under the first material, in such a manner as to contact with the first material; and a fourth material disposed on the one side of the second electrode which is disposed under the second material, in such a manner as to contact with the second material, wherein, when the moving part is electrically connected to the second electrode, the fourth material is placed in a position to contact with the second electrode later than the third material, and wherein the first material is the same as the third material, and the second material is the same as the fourth material.

7. The mechanical switch of claim 1, further comprising:

a third electrode disposed spaced apart from the first electrode and the second electrode; and a moving part including one side electrically connected to the second electrode, and the other side disposed above the first electrode, wherein the first material and the second material are disposed on one side of the first electrode which is disposed under the moving part, in such a manner as to contact with the other side of the moving part, and wherein, when the moving part is electrically connected to the first electrode, the second material is placed in a position to contact with the first electrode later than the first material.

8. The mechanical switch of claim 1, wherein, when the electrically connected first and second electrodes are separated from each other, after the second material is separated from the second electrode, the first material is separated from the second electrode.

9. A mechanical switch comprising:

a first electrode;

a second electrode spaced apart from the first electrode;

a first material electrically connected to the first electrode; and a second material electrically connected to the second electrode, wherein any one of a hardness, a Young's modulus, a melting point and an insensitivity degree to external contamination of the second material is lower than any corresponding one of a hardness, a Young's modulus, a melting point and an insensitivity degree to external contamination of the first material, and wherein, when the first electrode and the second electrode are electrically connected to each other, after the first material is connected to the second electrode, the second material is connected to the first electrode.

10. The mechanical switch of claim 9, further comprising:

a third electrode disposed spaced apart from the first electrode and the second electrode;

a first moving part including one side electrically connected to the first electrode, and the other side disposed above the second electrode; and a second moving part including one side electrically connected to the first electrode, and the other side disposed above the second electrode, wherein the first material is disposed on the other side of the first moving part, and the second material is disposed under the second moving part in such a manner as to contact with the other side of the second moving part, and is disposed on the second electrode.

11. The mechanical switch of claim 9, further comprising:

a third electrode disposed spaced apart from the first electrode and the second electrode;

a first moving part including one side electrically connected to the second electrode, and the other side disposed above the first electrode; and a second moving part including one side electrically connected to the second electrode, and the other side disposed above the first electrode, wherein the first material is disposed on one side of the first electrode which is disposed under the first moving part, in such a manner as to contact with the other side of the first moving part, and wherein the second material is disposed on the other side of the second moving part.

12. The mechanical switch of claim 9, further comprising:

a third electrode disposed spaced apart from the first electrode and the second electrode; and a moving part including one side electrically connected to the first electrode, and the other side disposed above the second electrode, wherein the first material is disposed on the other side of the moving part, and the second material is disposed on one side of the second electrode which is disposed under the moving part, in such a manner as to contact with the other side of the moving part, and wherein, when the moving part is electrically connected to the second electrode, the second material is placed in a position to contact with the second electrode later than the first material.

13. The mechanical switch of claim 9, further comprising:

a third electrode disposed spaced apart from the first electrode and the second electrode; and a moving part including one side electrically connected to the second electrode, and the other side disposed above the first electrode, wherein the first material is disposed on one side of the first electrode which is disposed under the moving part, in such a manner as to contact with the other side of the moving part, and the second material is disposed on the other side of the moving part, and wherein, when the moving part is electrically connected to the first electrode, the second material is placed in a position to contact with the first electrode later than the first material.

14. The mechanical switch of claim 9, wherein, when the electrically connected first and second electrodes are separated from each other, after the second material is separated from the first electrode, the first material is separated from the second electrode.

* * * * *